United States Patent
Song et al.

(10) Patent No.: US 9,412,894 B2
(45) Date of Patent: Aug. 9, 2016

(54) PHOTOVOLTAIC DEVICE INCLUDING GAP PASSIVATION LAYER AND METHOD OF MANUFACTURING THE SAME

(75) Inventors: Nam-Kyu Song, Yongin-si (KR); Min-Seok Oh, Yongin-si (KR); Yun-Seok Lee, Yongin-si (KR); Cho-Young Lee, Yongin-si (KR)

(73) Assignee: INTELLECTUAL KEYSTONE TECHNOLOGY LLC, McLean, VA (US)

( * ) Notice: Subject to any disclaimer, the term of this patent is extended or adjusted under 35 U.S.C. 154(b) by 898 days.

(21) Appl. No.: 13/569,142

(22) Filed: Aug. 7, 2012

(65) Prior Publication Data
US 2013/0113059 A1     May 9, 2013

(30) Foreign Application Priority Data
Nov. 7, 2011     (KR) .................. 10-2011-0115373

(51) Int. Cl.
| | |
|---|---|
| H01L 33/00 | (2010.01) |
| H01L 31/18 | (2006.01) |
| H01L 31/0224 | (2006.01) |
| H01L 31/0747 | (2012.01) |
| H01L 31/20 | (2006.01) |

(52) U.S. Cl.
CPC .... *H01L 31/1804* (2013.01); *H01L 31/022441* (2013.01); *H01L 31/0747* (2013.01); *H01L 31/202* (2013.01); *H01L 31/18* (2013.01); *Y02E 10/547* (2013.01); *Y02P 70/521* (2015.11)

(58) Field of Classification Search
CPC ............ H01L 31/022441; H01L 31/0747; H01L 31/202; H01L 31/1804; H01L 31/18
See application file for complete search history.

(56) References Cited

U.S. PATENT DOCUMENTS

| | | | |
|---|---|---|---|
| 4,745,078 A | 5/1988 | Stetter et al. | |
| 4,788,157 A | 11/1988 | Nakamura | |
| 4,948,740 A | 8/1990 | Plaettner | |
| 7,199,395 B2 * | 4/2007 | Terakawa | ............ H01L 31/0747 257/461 |
| 7,332,369 B2 | 2/2008 | Veres et al. | |

(Continued)

FOREIGN PATENT DOCUMENTS

| | | |
|---|---|---|
| EP | 2 239 788 | 10/2010 |
| JP | 2010-147102 A | 7/2010 |

(Continued)

OTHER PUBLICATIONS

Desrues, T. et al., "New Process Integration for Interdigitated Back Content (IBC) a-Si:H/c-Si Heterojunction Solar Cells," Proceedings of the 23rd European Photovoltaic Solar Energy Conference, Valencia Spain, Sep. 2008, pp, 1673-1676.

(Continued)

*Primary Examiner* — Caleb Henry
*Assistant Examiner* — Alexander Belousov

(57) ABSTRACT

A photovoltaic device includes a semiconductor substrate; an amorphous first conductive semiconductor layer on a first region of a first surface of the semiconductor substrate and containing a first impurity; an amorphous second conductive semiconductor layer on a second region of the first surface of the semiconductor substrate and containing a second impurity; and a gap passivation layer located between the first region and the second region on the semiconductor substrate, wherein the first conductive semiconductor layer is also on the gap passivation layer.

20 Claims, 6 Drawing Sheets

(56) References Cited

U.S. PATENT DOCUMENTS

| | | | |
|---|---|---|---|
| 2008/0257409 A1* | 10/2008 | Li | H01L 31/1852 136/259 |
| 2010/0087026 A1 | 4/2010 | Winkeler et al. | |
| 2010/0154869 A1* | 6/2010 | Oh | H01L 31/022425 136/252 |
| 2011/0041898 A1* | 2/2011 | Cornfeld | H01L 31/02 136/255 |
| 2011/0183459 A1* | 7/2011 | Kim | H01L 31/02168 438/72 |

FOREIGN PATENT DOCUMENTS

| | | |
|---|---|---|
| JP | 2010-157655 A | 7/2010 |
| KR | 10-0366348 B | 12/2002 |
| KR | 10-0756286 B | 9/2007 |
| WO | WO 2011/093329 | 4/2011 |

OTHER PUBLICATIONS

Rohatgi, A., "Designs and Fabrication Technologies for Future Commercial Crystalline Si Solar Cells," 15$^{th}$ Workshop on Crystalline Silicon Solar Cells & Modules: Materials and Processes, Aug. 2005, pp. 11-22.
Machine English Translation of JP 2010-147102, 14 pages.
Machine English Translation of JP 2010-157655, 25 pages.
Korean Patent Abstracts No. 10-2002-0059186 A for Patent No. KR 10-0366348 B, 2 pages.
Korean Patent Abstracts No. 10-2006-0100174 A for Patent No. KR 10-0756286 B, 2 pages.

* cited by examiner

PHOTOVOLTAIC DEVICE INCLUDING GAP PASSIVATION LAYER AND METHOD OF MANUFACTURING THE SAME

CROSS-REFERENCE TO RELATED APPLICATION

This application claims the benefit of Korean Patent Application No. 10-2011-0115373, filed on Nov. 7, 2011, in the Korean Intellectual Property Office, the disclosure of which is incorporated herein in its entirety by reference.

BACKGROUND

1. Field

One or more embodiments of the present invention relate to photovoltaic devices and methods of manufacturing the same.

2. Description of Related Art

A solar cell is a photovoltaic device for converting light, such as sunlight, to electric energy. Unlike other energy sources, solar energy is infinite and is an environmentally friendly energy source, and thus is becoming more and more important. The most basic structure of a solar cell is a diode formed of a PN junction and is categorized according to materials constituting a light absorbing layer.

Solar cells having light absorbing layers formed of silicon may be categorized into crystalline (for example, polycrystalline) wafer type solar cells and thin-film (amorphous, polycrystalline) type solar cells. The most popular examples of solar cells include compound thin-film solar cells using $CuInGaSe_2$ (CIGS) or CdTe, Group III-V solar cells, dye-sensitized solar cells, and organic solar cells.

A hetero-junction solar cell, which is a crystalline solar cell, uses a crystalline semiconductor substrate as a light absorbing layer, and a non-single crystal semiconductor layer having crystallinity different from that of the semiconductor substrate is formed on the crystalline semiconductor substrate to fabricate the hetero-junction solar cell.

A hetero-junction solar cell includes a positive electrode and a negative electrode on a front surface and a rear surface of a semiconductor substrate, respectively. In such a structure, electrodes are arranged on a surface to which sunlight is to be incident, thus interrupting incidence of sunlight.

Furthermore, a hetero-junction solar cell includes transparent conductive layers on a front surface and a rear surface of a semiconductor substrate. Therefore, there is a loss in a light transmitting ratio due to transparent conductive layers, and thus efficiency of light incidence decreases. Furthermore, resistance of a transparent conductive layer is greater than that of the electrodes, thus increasing overall resistance of a solar cell.

SUMMARY

Additional aspects will be set forth in part in the description which follows and, in part, will be apparent from the description.

According to one or more embodiments of the present invention, a photovoltaic device includes a crystalline semiconductor layer; an amorphous first conductive type semiconductor layer that is formed in a first region of a rear surface of the semiconductor substrate and contains a first impurity; an amorphous second conductive type semiconductor layer that is formed in a second region of the rear surface of the semiconductor substrate and contains a second impurity; and a gap passivation layer that is disposed between the first region and the second region on the semiconductor substrate, wherein the first conductive type semiconductor layer is disposed on the gap passivation layer.

The first conductive type semiconductor layer may completely cover the gap passivation layer.

At least one of surfaces of the semiconductor substrate may be textured.

The photovoltaic device may further include a first amorphous silicon (a-Si) layer interposed between the semiconductor substrate and the first conductive type semiconductor layer; a first transparent conductive layer formed on the first conductive type semiconductor layer; and a first metal electrode formed on the first transparent conductive layer.

A thickness of the gap passivation layer may be greater than a sum of thicknesses of the first a-Si layer, the first conductive type semiconductor layer, and the first transparent conductive layer.

The first a-Si layer, the first conductive type semiconductor layer, and the first transparent conductive layer may completely cover the gap passivation layer.

The photovoltaic device may further include a second amorphous silicon (a-Si) layer interposed between the semiconductor substrate and the second conductive type semiconductor layer; a second transparent conductive layer formed on the second conductive type semiconductor layer; and a second metal electrode formed on the second transparent conductive layer.

A thickness of the gap passivation layer may be greater than a sum of thicknesses of the second a-Si layer, the second conductive type semiconductor layer, and the second transparent conductive layer.

The photovoltaic device may further include a front surface protective layer formed on a front surface of the semiconductor substrate; a front surface field layer formed on the front surface of the semiconductor substrate; and an anti-reflection layer formed on the front surface protective layer and the front surface field layer.

The gap passivation layer may include a double layer including a $SiO_x$ layer and a $SiN_x$ layer or a double layer including a $SiO_x$ layer and a SiON layer.

At least one of the first a-Si layer and the second a-Si layer may be formed to have a thickness from about 20 Å to about 100 Å.

At least one of the first transparent conductive layer and the second transparent conductive layer may be formed to have a thickness from about 200 Å to about 1000 Å.

At least one of the first conductive type semiconductor layer and the second conductive type semiconductor layer may be formed to have a thickness from about 30 Å to about 100 Å.

The first conductive type semiconductor layer may be p-type, and the second conductive type semiconductor layer may be n-type.

The first conductive type semiconductor layer may be n-type, and the second conductive type semiconductor layer may be p-type.

The first region and the second region may be apart from each other by interposing the gap passivation layer therebetween and may be interspersed with each other.

According to one or more embodiments of the present invention, a method of manufacturing a photovoltaic device, the method includes a first patterning operation for opening a first region in a passivation layer formed on a rear surface of a semiconductor substrate; forming a first a-Si layer, a first conductive type semiconductor layer, and a first transparent conductive layer in the order stated on the rear surface of the semiconductor substrate including the passivation layer in which the first region is opened; forming an etch resist to cover the first region and portions of the passivation layer around the first region; a second patterning operation for opening a second region in the passivation layer by etching the passivation layer, the first a-Si layer, the first conductive type semiconductor layer, and the second transparent conductive layer which are not protected by the etch resist; forming a second a-Si layer, a second conductive type semiconductor layer, and a second transparent conductive layer in the order stated on the rear surface of the semiconductor substrate including the passivation layer in which the second region is opened; and removing the etch resist.

The passivation layer may include a double layer including a $SiO_x$ layer and a $SiN_x$ layer or a double layer including a $SiO_x$ layer and a SiON layer.

The first region and the second region may be apart from each other and may be alternately arranged.

The method may further include texturing the semiconductor substrate.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION OF THE EMBODIMENTS

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete. The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. While such terms as "first," "second," etc., may be used to describe various components, such components must not be limited to the above terms. The above terms are used only to distinguish one component from another.

It will also be understood that when a layer is referred to as being "on" another layer or substrate, it can be directly on the other layer or substrate, or intervening layers may also be present. However, when a layer is referred to as being "directly on" another layer or substrate, no intervening layers may be present.

Figure 1:
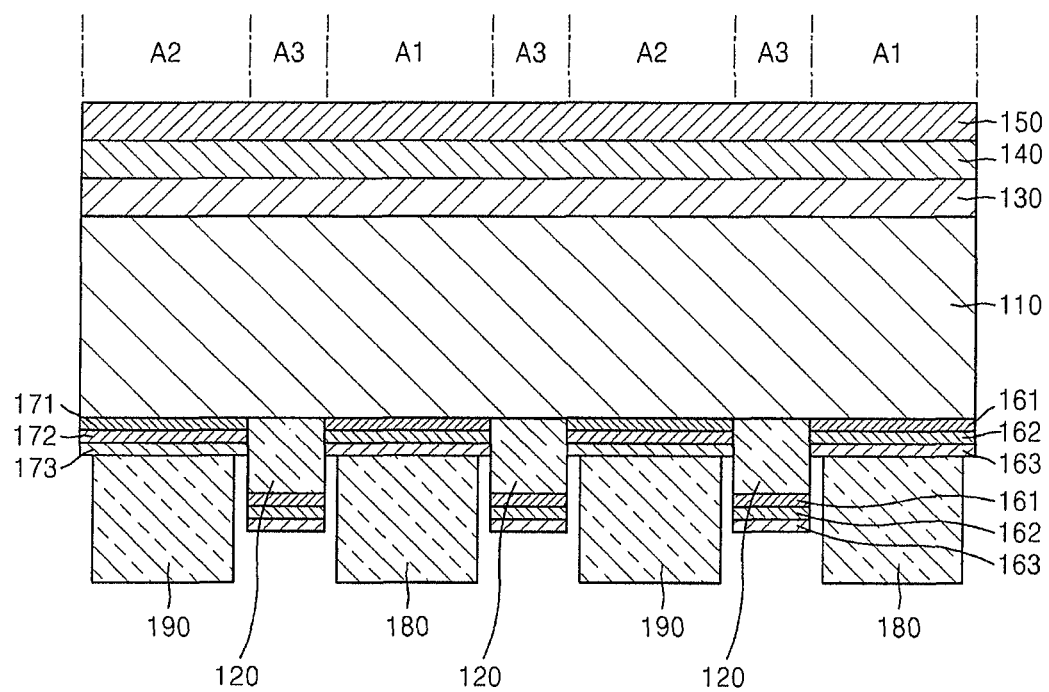
FIG. 1 is a schematic sectional view of a photovoltaic device according to an embodiment of the present invention.

FIG. 1 is a schematic sectional view of a photovoltaic device according to an embodiment of the present invention.

The photovoltaic device includes a semiconductor substrate 110, and a front surface protective layer 130, a front surface field layer 140, and an anti-reflection layer 150 that are formed on a front surface of the semiconductor substrate 110, and first and second amorphous silicon (a-Si) layers 161 and 171, first and second conductive type semiconductor layers 162 and 172, first and second transparent conductive layers 163 and 173, first and second metal electrodes 180 and 190, and a gap passivation layer 120 that are formed on a rear surface of the semiconductor substrate 110.

The semiconductor substrate 110 is a light absorbing layer and may include a crystalline silicon substrate. For example, the semiconductor substrate 110 may include a single crystal silicon substrate or a polycrystalline silicon substrate. The semiconductor substrate 110 may be a single crystal silicon substrate or a polycrystalline silicon substrate containing an n-type impurity. The n-type impurity may include group V chemical elements, such as phosphor (P) and arsenic (As).

Although a single crystal silicon substrate or a polycrystalline silicon substrate containing an n-type impurity is used as the semiconductor substrate 110 in the present embodiment, the present invention is not limited thereto. For example, a single crystal silicon substrate or a polycrystalline silicon substrate containing a p-type impurity may also be employed. The p-type impurity may include group III chemical elements, such as boron (B), aluminum (Al), and gallium (Ga).

The front surface protective layer 130 is formed on the front surface of the semiconductor substrate 110 to protect the semiconductor substrate 110 and may contain intrinsic a-Si (i a-Si). Alternatively, the front surface protective layer 130 may contain a-Si containing an n-type impurity (n a-Si) or the front surface protective layer 130 may be formed of an inorganic material containing combinations of Si, N, O, and H, e.g., silicon oxide ($SiO_x$) or silicon nitride ($SiN_x$).

The front surface field layer 140 may be formed on the front surface protective layer 130 and may contain a-Si doped with an impurity or $SiN_x$. If the front surface field layer 140 contains a-Si doped with an impurity, the a-Si may be doped with the same conductive impurity as the semiconductor substrate 110 at a higher concentration than in the semiconductor substrate 110. Therefore, as a potential barrier is formed due to a difference between impurity concentrations of the semiconductor substrate 110 and the front surface field layer 140, movement of holes to the front surface of the semiconductor substrate 110 is interfered with, and thus holes and electrons may be prevented from being recombined with each other nearby the front surface of the semiconductor substrate 110.

The anti-reflection layer 150 prevents loss of light absorption of the photovoltaic device due to reflection of light during incidence of sunlight, thus improving efficiency of the photovoltaic device. The anti-reflection layer 150 may contain a transparent material. For example, the anti-reflection layer 150 may contain $SiO_x$, $SiN_x$, silicon oxynitride ($SiO_xN_y$), etc. Alternatively, the anti-reflection layer 150 may contain titanium oxide ($TiO_x$), zinc oxide (ZnO), zinc sulfide (ZnS), etc. The anti-reflection layer 150 may be formed to include a single layer or a plurality of layers.

Although a case in which the front surface protective layer 130, the front surface field layer 140, and the anti-reflection layer 150 are individually formed on the front surface of the semiconductor substrate 110 is described in the present embodiment, the present invention is not limited thereto. For example, after the front surface protective layer 130 containing $SiO_x$ is formed, a film containing $SiN_x$ may be formed to function as both the front surface field layer 140 and the anti-reflection layer 150. Alternatively, after the front surface protecting layer 130 containing i a-Si or a-Si doped with an impurity is formed, a film containing $SiN_x$ may be formed to function as both the front surface field layer 140 and the anti-reflection layer 150.

The first a-Si layer 161, the first conductive type semiconductor layer 162, the first transparent conductive layer 163, and the first metal electrode 180 may be formed in a first region A1 of the rear surface of the semiconductor substrate 110. The first a-Si layer 161 may be formed in the first region A1 of the rear surface of the semiconductor substrate 110 and may contain i a-Si. The first conductive type semiconductor layer 162 may be formed on the first a-Si layer 161 and may contain a first impurity. For example, the first conductive type semiconductor layer 162 may be formed as a p+ layer by using a p-type impurity. The first transparent conductive layer 163 may be formed on the first conductive type semiconductor layer 162 and includes a transparent conductive film (TCO), such as ITO, IZO, and ZnO. The first metal electrode 180 formed on the first transparent conductive layer 163 may contain silver (Ag), gold (Au), copper (Cu), Al, or an alloy thereof.

The first conductive type semiconductor layer 162 formed of a-Si containing a p-type impurity forms a p-n junction with the semiconductor substrate 110. In this case, to improve the p-n junction property, the first a-Si layer 161 is located between the semiconductor substrate 110 and the first conductive type semiconductor layer 162. The first conductive type semiconductor layer 162 and the first a-Si layer 161 forms a hetero-junction with the semiconductor substrate 110, and thus an open circuit voltage of the photovoltaic device may increase. The first conductive type semiconductor layer 162 may be formed to have a thickness of between about 30 Å to about 100 Å, whereas the first a-Si layer 161 may be formed to have a thickness of between about 20 Å to about 100 Å.

The first transparent conductive layer 163 may improve ohmic contact between the first conductive type semiconductor layer 162 and the first metal electrode 180. The first transparent conductive layer 163 may be formed to have a thickness from about 200 Å to about 1000 Å. The first metal electrode 180 may be connected to an external device. According to the present embodiment, the first metal electrode 180 may be electrically connected to an external device as a positive electrode of the photovoltaic device.

The second a-Si layer 171, the second conductive type semiconductor layer 172, the second transparent conductive layer 173, and the second metal electrode 190 may be formed in a second region A2 of the rear surface of the semiconductor substrate 110.

The second a-Si layer 171 is formed in the second region A2 of the rear surface of the semiconductor substrate 110 and may include i a-Si. The second conductive type semiconductor layer 172 is formed on the second a-Si layer 171 and may include a second impurity. For example, the second conductive type semiconductor layer 172 may be formed as an n+ layer by using an n-type impurity. The second transparent conductive layer 173 includes a transparent conductive film (TCO), such as ITO, IZO, and ZnO, and the second metal electrode 190 formed on the second transparent conductive layer 173 may contain AG, Au, Cu, Al, or an alloy thereof.

The second conductive type semiconductor layer 172 containing a-Si containing an n-type impurity may have a higher impurity concentration than in the semiconductor substrate 110. The second conductive type semiconductor layer 172 may be formed to have a thickness from about 30 Å to about 100 Å and may form a rear electric field together with the second a-Si layer 171 to prevent holes and electrons from being recombined with each other nearby the front surface of the semiconductor substrate 110. The second a-Si layer 171 may be formed to have a thickness from about 20 Å to about 100 Å.

The second transparent conductive layer 173 is formed to have a thickness from about 200 Å to about 1000 Å and may enhance ohmic contact between the second conductive type semiconductor layer 172 and the second metal electrode 190. The second metal electrode 190 may be connected to an external device. According to the present embodiment, the second metal electrode 190 may be electrically connected to an external device as a negative electrode of the photovoltaic device.

A gap passivation layer 120 is arranged in a third region A3 of the rear surface of the semiconductor substrate 110, and the first a-Si layer 161, the first conductive type semiconductor layer 162, and the first transparent conductive layer 163 are stacked on the gap passivation layer 120 in the order stated. The gap passivation layer 120 prevents the semiconductor substrate 110 from being exposed to outside elements, so that holes and electrons may be prevented from being recombined with each other.

The thickness of the gap passivation layer 120 may be greater than a sum of thicknesses of layers arranged around the gap passivation layer 120. For example, the thickness of the gap passivation layer 120 may be greater than a sum of the thicknesses of the first a-Si layer 161, the first conductive type semiconductor layer 162, and the first transparent conductive layer 163 and greater than a sum of the thicknesses of the second a-Si layer 171, the second conductive type semiconductor layer 172, and the second transparent conductive layer 173. The thickness of the gap passivation layer 120 may be from about 1000 Å to about 1500 Å.

If the thickness of the gap passivation layer 120 is smaller than a sum of the thicknesses of layers arranged around the gap passivation layer 120, efficiency of the gap passivation layer 120 may be deteriorated. For example, electrons and holes may not be effectively prevented from being recombined with each other.

The gap passivation layer 120 is formed directly on the semiconductor substrate 110 and prevents the semiconductor substrate 110 from being exposed to outside elements. The gap passivation layer 120 may be formed as a double layer including a $SiO_x$ layer and a $SiN_x$ layer or a double layer including a $SiO_x$ layer and a $SiO_xN_y$ layer. Alternatively, the gap passivation layer 120 may be formed as a single layer.

The gap passivation layer 120 is formed by forming a passivation layer in which the first region A1 is opened before the first a-Si layer 161 is formed and then opening the second region A2 of the passivation layer before the second a-Si layer 171 is formed. According to such method, the width of the gap passivation layer 120 may be minimized, and possible damages that occur during formation of the first conductive type semiconductor layer 162 and the second conductive type semiconductor layer 172 may be minimized. The width of the gap passivation layer 120 may be smaller than or equal to 100 μm, e.g., the width of the gap passivation layer 120 may be from about 30 μm to about 50 μm. If the gap passivation layer 120 is formed to have an excessive width, efficiency of the photovoltaic device may be significantly deteriorated.

The first a-Si layer 161, the first conductive type semiconductor layer 162, and the first transparent conductive layer 163 are formed on the gap passivation layer 120 in the order stated according to a method of manufacturing a photovoltaic device as described above.

Hereinafter, a method of manufacturing a photovoltaic device according to an embodiment of the present invention will be described with reference to FIGS. 2 and 10.

Figure 2:
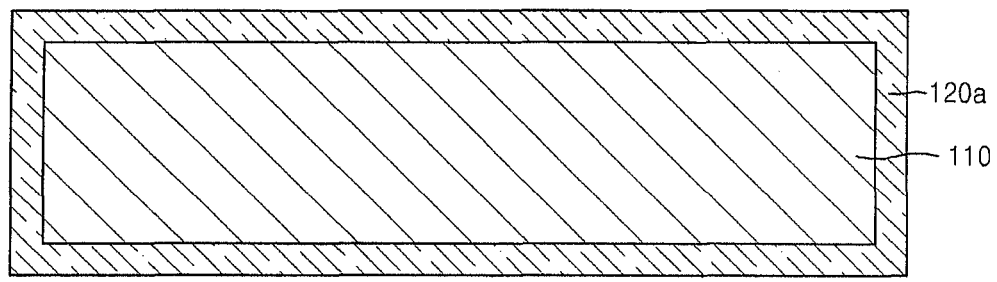
FIGS. 2 through 10 are schematic sectional views showing steps of an exemplary method of manufacturing the photovoltaic device of FIG. 1.

Referring to FIG. 2, a passivation layer 120a is formed on the semiconductor substrate 110 containing crystalline silicon. The passivation layer 120a may be formed to have a thickness from about 1000 Å to about 1500 Å.

The passivation layer 120a may be formed of a plurality of layers. For example, the passivation layer 120a may be formed by forming a film containing $SiO_x$ and forming a film containing $SiN_x$. Alternatively, the passivation layer 120a may be formed by forming a film containing $SiO_x$ and forming a film containing $SiO_xN_y$. Alternatively, the passivation layer 120a may be formed of a single layer, if required.

Figure 3:
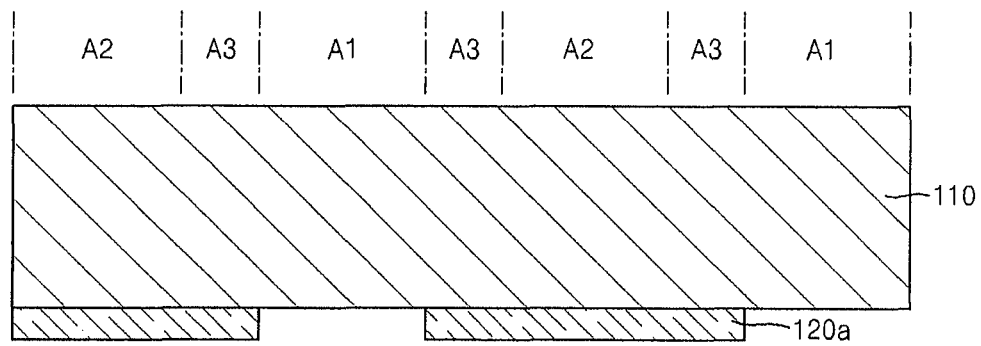

Referring to FIG. 3, a patterning operation is formed to remove a portion of the passivation layer 120a formed on the semiconductor substrate 110, that is, the first region A1. The patterning operation may be an etching operation. For example, the first region A1 may be patterned via wet-etching. Here, only the first region A1 is removed from the passivation layer 120a formed on the rear surface of the semiconductor substrate 110, and a portion of the semiconductor substrate 110 corresponding to the first region A1 may be exposed by the patterning operation. The first region A1 is a region in which the first a-Si layer 161, the first conductive type semiconductor layer 162, and the first transparent conductive layer 163 are formed in operations described below. In one embodiment, the passivation layer 120a formed on the front and side surfaces of the semiconductor substrate 110 may be completely removed.

Figure 4:
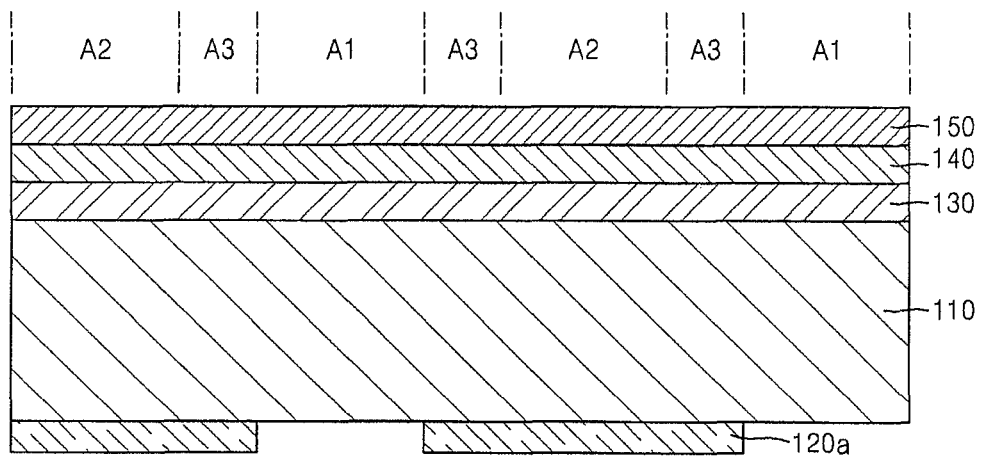

Referring to FIG. 4, the front surface protective layer 130, the front surface field layer 140, and the anti-reflection layer 150 are formed on the front surface of the semiconductor substrate 110 in the order stated.

The front surface protective layer 130 may contain i a-Si, a-Si containing an impurity, or an inorganic material, such as $SiO_x$ and $SiN_x$, and is formed to completely cover the front surface of the semiconductor substrate 110. The front surface protective layer 130 may be formed via a chemical vapor deposition method, such as plasma chemical vapor deposition (PECVD), a physical method, such as sputtering or spin coating, a chemical method, or a physical-chemical method.

The front surface field layer 140 may include a-Si doped with an impurity or $SiN_X$ and is formed to completely cover the front surface protective layer 130. The front surface field layer 140 may be formed via PECVD, where the a-Si doped with an impurity may have a higher impurity concentration than the semiconductor substrate 110.

The anti-reflection layer 150 may contain $SiO_x$, $SiN_x$, $SiO_xN_y$, etc. Alternatively, the anti-reflection layer 150 may contain $TiO_2$, ZnO, ZnS, etc. The anti-reflection layer 150 may be formed via a method such as CVD, sputtering, or spin coating.

Although a case where the front surface protective layer 130, the front surface field layer 140, and the anti-reflection layer 150 are individually formed is described in the present embodiment, the present invention is not limited thereto. For example, after the front surface protective layer 130 containing $SiO_x$ is formed, a film that contains $SiN_x$ and may function as both the front surface field layer 140 and the anti-reflection layer 150 simultaneously may be formed, as described above.

Figure 5:
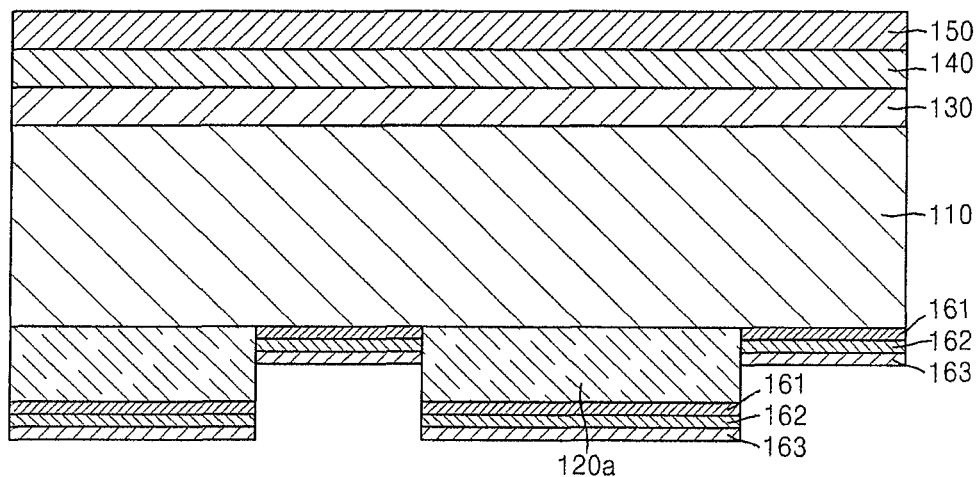

Referring to FIG. 5, the first a-Si layer 161, the first conductive type semiconductor layer 162, and the first transparent conductive layer 163 are formed in the order stated on the rear surface of the semiconductor substrate 110 having the passivation layer 120a in which the first region A1 is opened.

The first a-Si layer 161 may contain i a-Si. For example, the first a-Si layer 161 having a thickness from about 20 Å to about 100 Å may be formed via a method such as PECVD. For example, the first conductive type semiconductor layer 162 may be formed by injecting $SiH_4$, hydrogen (H), etc. into a vacuum chamber, injecting an impurity containing a group III chemical element, and performing a chemical vapor deposition method, such as PECVD. The first transparent conductive layer 163 may contain ITO, IZO, IWO, IGdO, IZrO, INdO, ZnO, etc. and may be formed via a method such as sputtering, e-beam, evaporation, etc.

Since the first a-Si layer 161, the first conductive type semiconductor layer 162, and the first transparent conductive layer 163 are formed to completely cover the rear surface of the semiconductor substrate 110 having the passivation layer 120a in which the first region A1 is opened, the first a-Si layer 161, the first conductive type semiconductor layer 162, and the first transparent conductive layer 163 are formed not only on the semiconductor substrate 110, but also on the passivation layer 120a.

Figure 6:
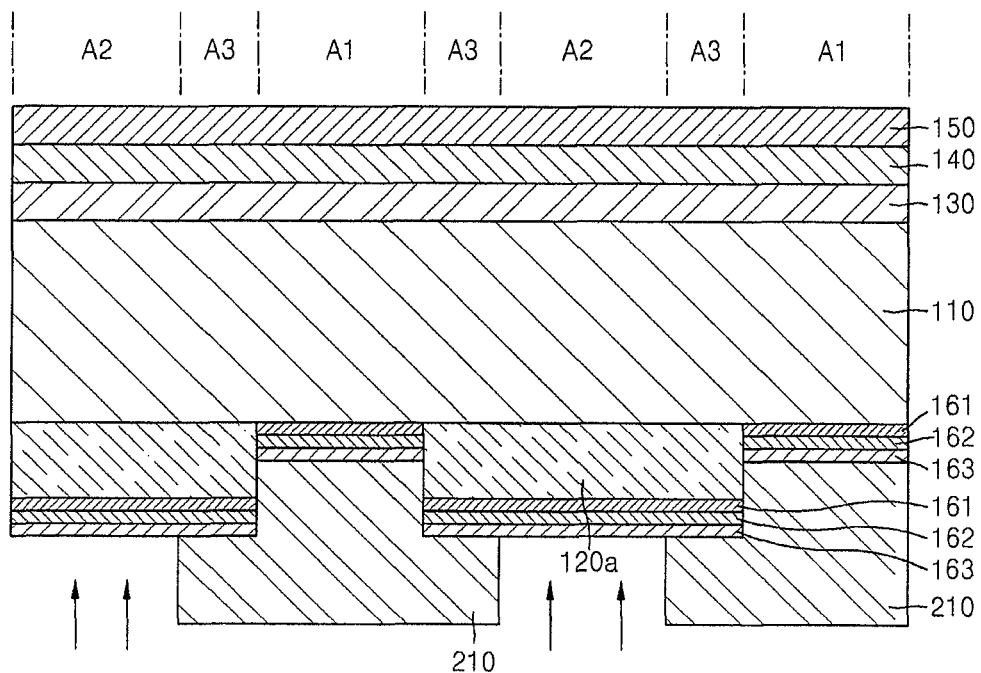

Referring to FIG. 6, an etch resist 210 is formed. Here, the etch resist 210 is formed to cover the first region A1 and a portion of the passivation layer 120a formed around the first region A1. The portion of the passivation layer 120a covered by the etch resist 210 becomes the gap passivation layer 120 as shown in FIG. 10.

Figure 7:
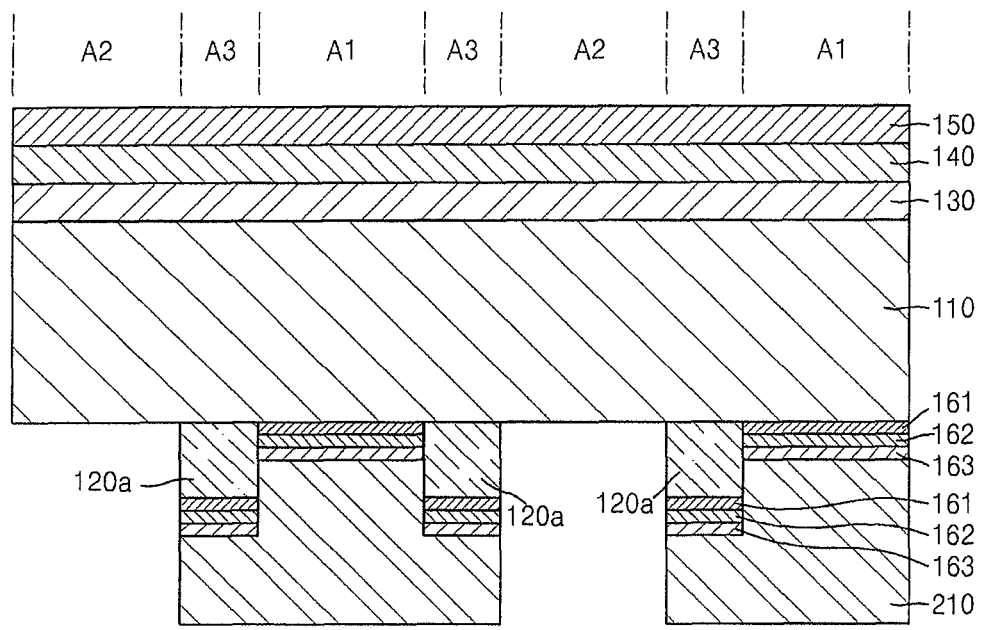

Referring to FIG. 7, the second region A2 of the passivation layer 120a is opened by etching the passivation layer 120a, the first a-Si layer 161, the first conductive type semiconductor layer 162, and the first transparent conductive layer 163, which are formed on the rear surface of the semiconductor substrate 110, by using the etch resist 210 as a mask.

The passivation layer 120a, the first a-Si layer 161, the first conductive type semiconductor layer 162, and the first transparent conductive layer 163 may be etched via wet-etching or dry-etching in regions not covered by the etch resist 210. In one embodiment, the passivation layer 120a, the first a-Si layer 161, the first conductive type semiconductor layer 162, and the first transparent conductive layer 163 in the region covered by the etch resist 210 are protected during the etching operation.

A portion of the semiconductor substrate 110 corresponding to the second region A2 is exposed through a second patterning operation as described above. The second region A2 is a region in which the second a-Si layer 171, the second conductive type semiconductor layer 172, and the second transparent conductive layer 173 are formed in operations described below.

Figure 8:
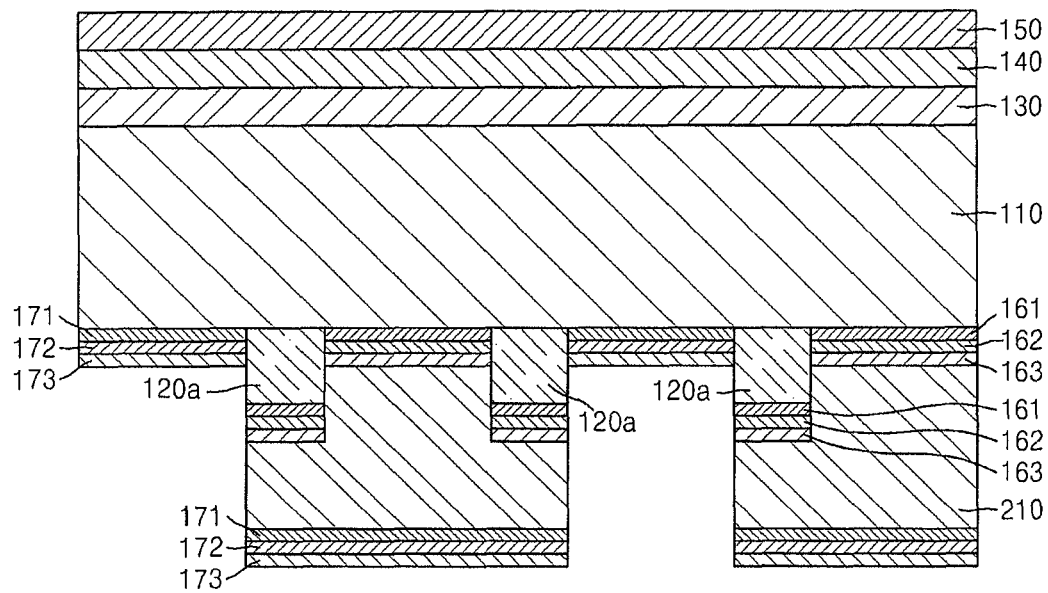

Referring to FIG. 8, the second a-Si layer 171, the second conductive type semiconductor layer 172, and the second transparent conductive layer 173 are formed in the order stated on the rear surface of the semiconductor substrate 110 in which a portion corresponding to the second region A2 is opened.

The second a-Si layer 171 may contain i a-Si. For example, the second a-Si layer 171 having a thickness from about 20 Å to about 100 Å may be formed via a method such as PECVD. For example, the second conductive type semiconductor layer 172 may be formed by injecting $SiH_4$, hydrogen (H), etc. into a vacuum chamber, injecting an impurity containing a group V chemical element, and performing a chemical vapor deposition method, such as PECVD. The second transparent conductive layer 173 contains ITO, IZO, IWO, IGdO, IZrO, INdO, ZnO, etc. and may be formed via a method such as sputtering, e-beam, evaporation, etc.

Since the second a-Si layer 171, the second conductive type semiconductor layer 172, and the second transparent conductive layer 173 are formed to completely cover the rear surface of the semiconductor substrate 110 having the passivation layer 120a in which the second region A2 is opened, the second a-Si layer 171, the second conductive type semiconductor layer 172, and the second transparent conductive layer 173 are formed not only on the semiconductor substrate 110, but also on the etch resist 210. However, since the passivation layer 120a is covered by the etch resist 210, the second a-Si layer 171, the second conductive type semiconductor layer 172, and the second transparent conductive layer 173 are not formed directly on the passivation layer 120a.

Figure 9:
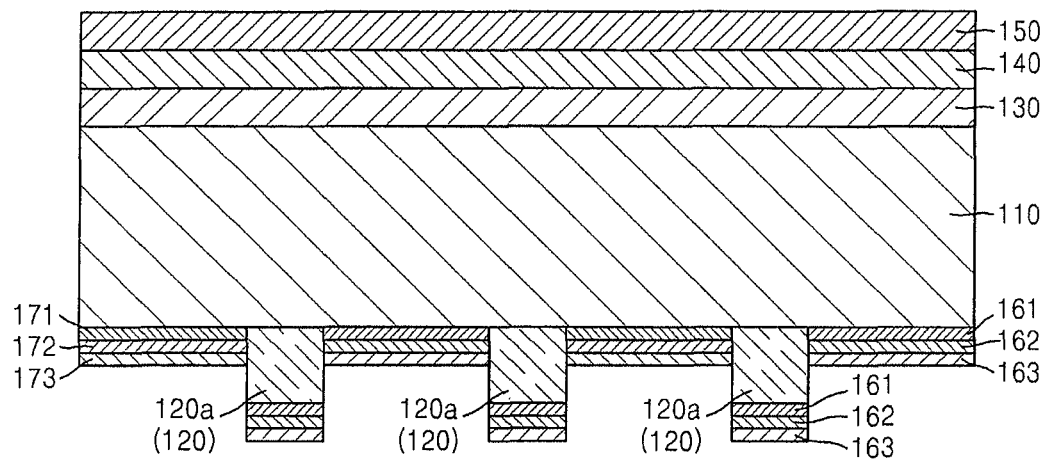

Referring to FIG. 9, the etch resist 210 is removed. When the etch resist 210 is removed, the second a-Si layer 171, the second conductive type semiconductor layer 172, and the second transparent conductive layer 173 formed on the etch resist 210 are also removed. As the etch resist 210 is removed, a stacked structure covered by the etch resist 210 and including the first a-Si layer 161, the first conductive type semiconductor layer 162, and the first transparent conductive layer 163 is exposed.

The first a-Si layer 161, the first conductive type semiconductor layer 162, and the first transparent conductive layer 163 are arranged not only on the first region Al, but also on the gap passivation layer 120.

According to such process, the first a-Si layer 161, the first conductive type semiconductor layer 162, and the first transparent conductive layer 163 are formed in the first region A1, whereas the second a-Si layer 171, the second conductive type semiconductor layer 172, and the second transparent conductive layer 173 are formed in the second region A2. Furthermore, the gap passivation layer 120 is formed between the first region A1 and the second region A2.

Figure 10:
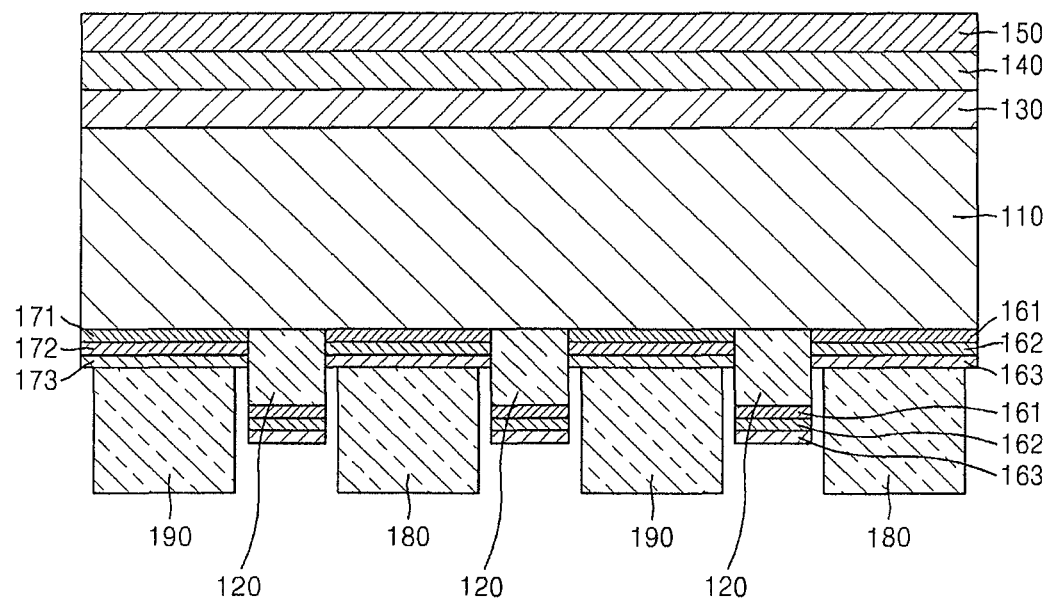

Referring to FIG. 10, the first metal electrode 180 and the second metal electrode 190 are formed. The first metal electrode 180 is formed on the first transparent conductive layer 163, whereas the second metal electrode 190 is formed on the second transparent conductive layer 173. The first and second metal electrodes 180 and 190 may contain Ag, Au, Cu, Al, or an alloy thereof. For example, first and second metal electrodes 180 and 190 may be formed by using a conductive paste containing the above-stated element(s) via a coating method such as inkjet printing, gravure printing, offset printing, screen printing, etc.

In a method of manufacturing a photovoltaic device according to a comparative embodiment, the method may include two operations. In first operation, a first a-Si layer, a first conductive type semiconductor layer, and a first transparent conductive layer are formed to completely cover a surface in which a passivation layer is formed with a first and second regions are opened, and then the first a-Si layer, the first conductive type semiconductor layer, and the first transparent conductive layer are partially removed by etching such that the first a-Si layer, the first conductive type semiconductor layer, and the first transparent conductive layer, which correspond to the first region, remain. In second operation, a second a-Si layer, a second conductive type semiconductor layer, and a second transparent conductive layer are formed to completely cover the surface in which the passivation layer is formed, and then the second a-Si layer, the second conductive type semiconductor layer, and the second transparent conductive layer are partially removed by etching such that the second a-Si layer, the second conductive type semiconductor layer, and the second transparent conductive layer, which correspond to the second region, remain.

During the etching according to the comparative embodiment, since etching selectivity of the first conductive semiconductor layer, which is a p+layer, and etching selectivity of the second conductive type semiconductor layer, which is an n+layer, with respect to each other is relatively low, damages to a rear surface of a photovoltaic device may be induced. Furthermore, if the width of a gap passivation layer between the first region and the second region is similar to that of the gap passivation layer 120 according to an embodiment of the present invention, it is difficult to calibrate alignment during a printing operation, and thus quality of the photovoltaic device is deteriorated.

However, the method of manufacturing a photovoltaic device according to an embodiment of the present invention includes relatively simple operations. And, since a first conductive type semiconductor layer is formed after the first region A1 is opened and a second conductive type semiconductor layer is formed after the second region A2 is opened, it is easy to calibrate alignment during a printing operation, and thus a high quality photovoltaic device may be manufactured.

Figure 11:
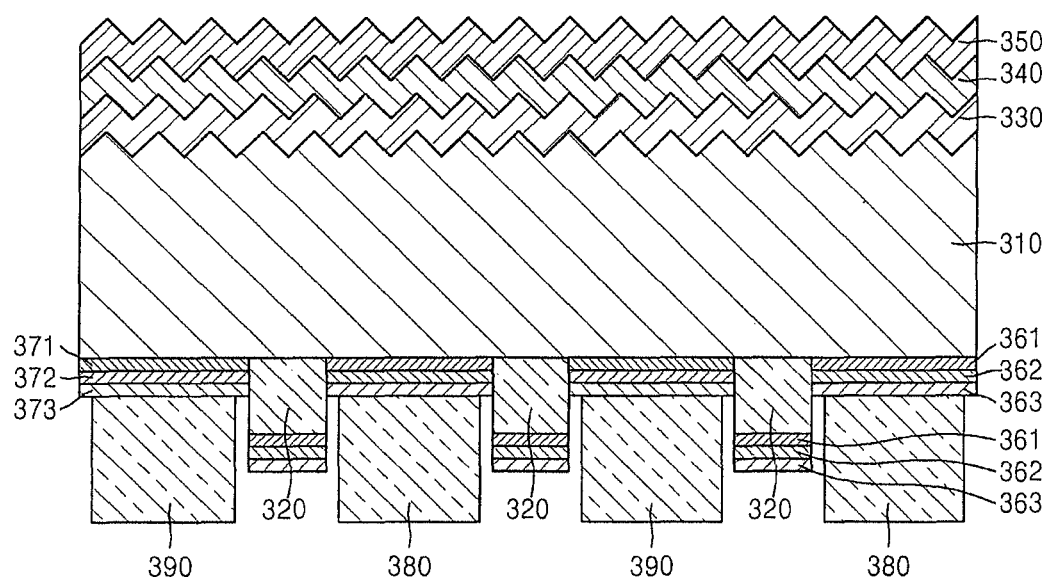
FIG. 11 is a schematic sectional view of a photovoltaic device according to another embodiment of the present invention.

FIG. 11 is a schematic sectional view of a photovoltaic device according to another embodiment of the present invention.

Referring to FIG. 11, the photovoltaic device according to the present embodiment includes a semiconductor substrate 310, a front surface protective layer 330, a front surface field layer 340, and an anti-reflection layer 350 that are formed on a front surface of the semiconductor substrate 310, and first and second a-Si layers 361 and 371, first and second conductive type semiconductor layers 362 and 372, first and second transparent conductive layers 363 and 373, first and second metal electrodes 380 and 390, and a gap passivation layer 320 that are formed on a rear surface of the semiconductor substrate 310.

In one embodiment, the photovoltaic device according to the present embodiment is substantially similar to the photovoltaic device according to the previous embodiment except that the front surface of the semiconductor substrate 310 is textured. Descriptions of configurations of the photovoltaic device according to the present embodiment that are identical to the those of the photovoltaic device according to the previous embodiment shown in FIG. 1 will be omitted, and descriptions below will focus on differences between the previous embodiment and the present embodiment.

The front surface of the semiconductor substrate 310, which is a light absorbing layer, may be textured. A number of light paths for incident light may be increased by texturing the front surface of the semiconductor substrate 310, and thus light absorbing efficiency may be improved. As an example of a texturing operation, the semiconductor substrate may be dipped into a mixture of a KOH or NaOH solution and isopropyl alcohol (IPA). As a result, a pyramid-type texture may be formed.

Since the front surface of the semiconductor substrate 310 is textured, the front surface protective layer 330, the front surface field layer 340, and the anti-reflection layer 350 formed on the front surface of the semiconductor substrate 310 also include uneven surfaces in correspondence to the shape of the texture.

The method of manufacturing a photovoltaic device according to the present embodiment is identical to the method described above with reference to FIGS. 2 through 10, except that the semiconductor substrate 310 of which the front surface is textured is employed in the present embodiment.

Although the front surface of the semiconductor substrate 310 is textured in a photovoltaic device according to the present embodiment, the present invention is not limited thereto. For example, the rear surface of the semiconductor substrate 310 may also be textured. In this case, the first and second a-Si layers 361 and 371, the first and second conductive type semiconductor layers 362 and 372, and the first and second transparent conductive layers 363 and 373 formed on the rear surface of the semiconductor substrate 310 may or may not include uneven surfaces in correspondence to the shape of the texture.

According to the embodiments as described above, after the first a-Si layers 161 and 361, the first conductive type semiconductor layer 162 and 362 which is p-type semiconductor layer, and the first transparent conductive layer 163 and 363 are formed, the second a-Si layers 171 and 371, the second conductive type semiconductor layer 172 and 372 which is n-type semiconductor layer, and the second transparent conductive layer 173 and 373 are formed. However, the present invention is not limited thereto.

For example, after the second a-Si layers 171 and 371, the second conductive type semiconductor layer 172 and 372 which is n-type semiconductor layer, and the second transparent conductive layer 173 and 373 are formed, the first a-Si layers 161 and 361, the first conductive type semiconductor layer 162 and 362 which is p-type semiconductor layer, and the first transparent conductive layer 163 and 363 may be formed. In this case, a semiconductor layer formed to completely cover the gap passivation layers 120 and 320 is the second conductive type semiconductor layer 172 and 372 which is an n-type semiconductor layer.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A photovoltaic device comprising:
   a semiconductor substrate;
   a first amorphous conductive semiconductor layer on a first region of a first surface of the semiconductor substrate and containing a first impurity;
   a second amorphous conductive semiconductor layer on a second region of the first surface of the semiconductor substrate and containing a second impurity;
   a gap passivation layer formed on the first surface of the semiconductor substrate between the first amorphous conductive semiconductor layer on the first region and the second amorphous conductive semiconductor layer on the second region; and
   a third amorphous conductive semiconductor layer containing the first impurity on the gap passivation layer.

2. The photovoltaic device of claim 1, wherein the third amorphous conductive semiconductor layer completely covers the gap passivation layer.

3. The photovoltaic device of claim 1, wherein at least one of surfaces of the semiconductor substrate is textured.

4. The photovoltaic device of claim 1, further comprising:
   a first amorphous silicon layer located between the semiconductor substrate and the first amorphous conductive semiconductor layer;
   a first transparent conductive layer on the first amorphous conductive semiconductor layer; and
   a first metal electrode on the first transparent conductive layer.

5. The photovoltaic device of claim 4, wherein a thickness of the gap passivation layer is greater than a sum of thicknesses of the first amorphous silicon layer, the first amorphous conductive semiconductor layer, and the first transparent conductive layer.

6. The photovoltaic device of claim 4, further comprising:
   a third amorphous silicon layer between the gap passivation layer and the third amorphous conductive semiconductor layer; and
   a third transparent conductive layer on the third amorphous conductive semiconductor layer to completely cover the gap passivation layer.

7. The photovoltaic device of claim 4, further comprising:
   a second amorphous silicon layer located between the semiconductor substrate and the second amorphous conductive semiconductor layer;
   a second transparent conductive layer on the second amorphous conductive semiconductor layer; and
   a second metal electrode on the second transparent conductive layer.

8. The photovoltaic device of claim 7, wherein a thickness of the gap passivation layer is greater than a sum of thicknesses of the second amorphous silicon layer, the second amorphous conductive semiconductor layer, and the second transparent conductive layer.

9. The photovoltaic device of claim 7, wherein at least one of the first amorphous silicon layer and the second amorphous silicon layer has a thickness of between about 20 Å to about 100 Å.

10. The photovoltaic device of claim 7, wherein at least one of the first transparent conductive layer and the second transparent conductive layer has a thickness between about 200 Å to about 1000 Å.

11. The photovoltaic device of claim 1, further comprising:
    a protective layer on a second surface of the semiconductor substrate generally opposite to the first surface;
    a field layer formed on the second surface of the semiconductor substrate; and
    an anti-reflection layer formed on the protective layer and the field layer.

12. The photovoltaic device of claim 1, wherein the gap passivation layer comprises a double layer including a $SiO_x$ layer and a $SiN_x$ layer or a double layer including a $SiO_x$ layer and a SiON layer.

13. The photovoltaic device of claim 1, wherein at least one of the first conductive semiconductor layer and the second conductive semiconductor layer has a thickness between about 30 Å to about 100 Å.

14. The photovoltaic device of claim 1, wherein the first amorphous conductive semiconductor layer is p-type from the first impurity and the second amorphous conductive semiconductor layer is n-type from the second impurity.

15. The photovoltaic device of claim 1, wherein the first amorphous conductive semiconductor layer is n-type from the first impurity and the second amorphous conductive semiconductor layer is p-type from the second impurity.

16. The photoelectric device of claim 15, wherein the semiconductor substrate is a n-type semiconductor substrate.

17. The photovoltaic device of claim 1, wherein:
    the first region comprises a plurality of first regions;
    the second region comprises a plurality of second regions;
    the gap passivation layer comprises a plurality of gap passivation layers;
    each of the plurality of first regions are adjacent to at least one of the plurality of second regions;
    each of the plurality of gap passivation layers are interspersed between each of the plurality of first regions that are adjacent to each of the plurality of second regions.

18. The photoelectric device of claim 1, wherein the first amorphous conductive semiconductor layer and the third amorphous semiconductor layer comprise an emitter of the photoelectric device.

19. The photoelectric device of claim 1, wherein the second amorphous conductive semiconductor layer comprise a base of the photoelectric device.

20. The photoelectric device of claim 1, wherein the first amorphous conductive semiconductor layer and the third amorphous semiconductor layer are formed of the same materials.

* * * * *